United States Patent
Sakiyama

(10) Patent No.: US 9,190,368 B2
(45) Date of Patent: Nov. 17, 2015

(54) SEMICONDUCTOR DEVICE THAT ATTENUATES HIGH-FREQUENCY OSCILLATION

(71) Applicant: KABUSHIKI KAISHA TOSHIBA, Tokyo (JP)

(72) Inventor: Yoko Sakiyama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/017,226

(22) Filed: Sep. 3, 2013

(65) Prior Publication Data

US 2014/0284617 A1    Sep. 25, 2014

(30) Foreign Application Priority Data

Mar. 22, 2013   (JP) .................................. 2013-060756

(51) Int. Cl.
| H01L 23/48 | (2006.01) |
| --- | --- |
| H01L 23/00 | (2006.01) |
| H01L 25/18 | (2006.01) |
| H01L 23/66 | (2006.01) |

(52) U.S. Cl.
CPC ................ *H01L 24/03* (2013.01); *H01L 24/49* (2013.01); *H01L 25/18* (2013.01); *H01L 23/66* (2013.01); *H01L 24/32* (2013.01); *H01L 24/48* (2013.01); *H01L 24/73* (2013.01); *H01L 24/85* (2013.01); *H01L 2223/6611* (2013.01); *H01L 2224/04042* (2013.01); *H01L 2224/0603* (2013.01); *H01L 2224/32225* (2013.01); *H01L 2224/48137* (2013.01); *H01L 2224/48227* (2013.01); *H01L 2224/49175* (2013.01); *H01L 2224/73265* (2013.01); *H01L 2224/85447* (2013.01); *H01L 2924/10253* (2013.01); *H01L 2924/10272* (2013.01); *H01L 2924/1203* (2013.01); *H01L 2924/1305* (2013.01); *H01L 2924/13055* (2013.01); *H01L 2924/19107* (2013.01); *H01L 2924/30101* (2013.01); *H01L 2924/30107* (2013.01)

(58) Field of Classification Search
CPC ......... H01L 24/03; H01L 24/49; H01L 25/18; H01L 2223/6611; H01L 2224/04042; H01L 2224/0603; H01L 2224/32225; H01L 2224/48137; H01L 2224/48227; H01L 2224/49175; H01L 2224/73265; H01L 2224/85447; H01L 23/66; H01L 24/32
USPC .................. 257/666, 676–678, 724, 777–778
See application file for complete search history.

(56) References Cited

U.S. PATENT DOCUMENTS

| 6,552,429 B2 | 4/2003 | Arai et al. |
| --- | --- | --- |
| 2001/0033018 A1 * | 10/2001 | Kimura ........................ 257/730 |

(Continued)

FOREIGN PATENT DOCUMENTS

| JP | H11163257 A | 6/1999 |
| --- | --- | --- |
| JP | 2002141465 A | 5/2002 |
| JP | 2010-178615 | 8/2010 |

*Primary Examiner* — Thanh T Nguyen
(74) *Attorney, Agent, or Firm* — Patterson & Sheridan, LLP

(57) ABSTRACT

According to embodiments, a semiconductor device includes an insulating substrate, a first electrode plate disposed on the insulating substrate, a second electrode plate disposed on the insulating substrate, a third electrode plate disposed on the insulating substrate, a first semiconductor element disposed on the first electrode plate, a first electrode of the first semiconductor element being electrically connected to the first electrode plate, a second semiconductor element disposed on the second electrode plate, a first electrode of the second semiconductor element being electrically connected to the second electrode plate, a first bonding wire electrically connecting a second electrode of the first semiconductor element to the third electrode plate, and a second bonding wire electrically connecting a second electrode of the second semiconductor element to the third electrode plate.

9 Claims, 3 Drawing Sheets

(56) References Cited

U.S. PATENT DOCUMENTS

| | | |
|---|---|---|
| 2002/0030268 A1* | 3/2002 | Sakamoto et al. ............ 257/700 |
| 2013/0181228 A1* | 7/2013 | Usui et al. ....................... 257/77 |
| 2014/0061673 A1* | 3/2014 | Miyanagi ......................... 257/77 |

* cited by examiner

SEMICONDUCTOR DEVICE THAT ATTENUATES HIGH-FREQUENCY OSCILLATION

CROSS-REFERENCE TO RELATED APPLICATION

This application is based upon and claims the benefit of priority from Japanese Patent Application No. 2013-060756, filed Mar. 22, 2013, the entire contents of which are incorporated herein by reference.

FIELD

Embodiments described herein relate generally to a semiconductor device.

BACKGROUND

In a semiconductor device in which a plurality of semiconductor chips are connected in parallel, an oscillation of the semiconductor device can be suppressed by reducing a parasitic inductance or a parasitic resistance of a bonding wire connecting the semiconductor chips. However, when the parasitic inductance of the bonding wire is reduced, a high-frequency oscillation may be generated, where a frequency $\omega$ satisfying a resonance condition is represented as $\omega=(LC)^{-1/2}$ (L and C represent the inductance and the capacitance of the semiconductor device, respectively). In the semiconductor device having such a high-frequency oscillation, a malfunction may occur when a voltage that exceeds a gate breakdown voltage or a breakdown voltage between main electrodes is applied to the semiconductor device.

DETAILED DESCRIPTION

A semiconductor device that includes a plurality of semiconductor chips and can attenuate oscillation promptly is described.

In general, according to embodiments, a semiconductor device includes an insulating substrate, a first electrode plate disposed on the insulating substrate, a second electrode plate disposed on the insulating substrate, a third electrode plate disposed on the insulating substrate, a first semiconductor element disposed on the first electrode plate, a first electrode of the first semiconductor element being electrically connected to the first electrode plate, a second semiconductor element disposed on the second electrode plate, a first electrode of the second semiconductor element being electrically connected to the second electrode plate, a first bonding wire electrically connecting a second electrode of the first semiconductor element to the third electrode plate, and a second bonding wire electrically connecting a second electrode of the second semiconductor element to the third electrode plate.

Hereinafter, embodiments will be described with reference to the drawings.

First Embodiment

Figure 1:
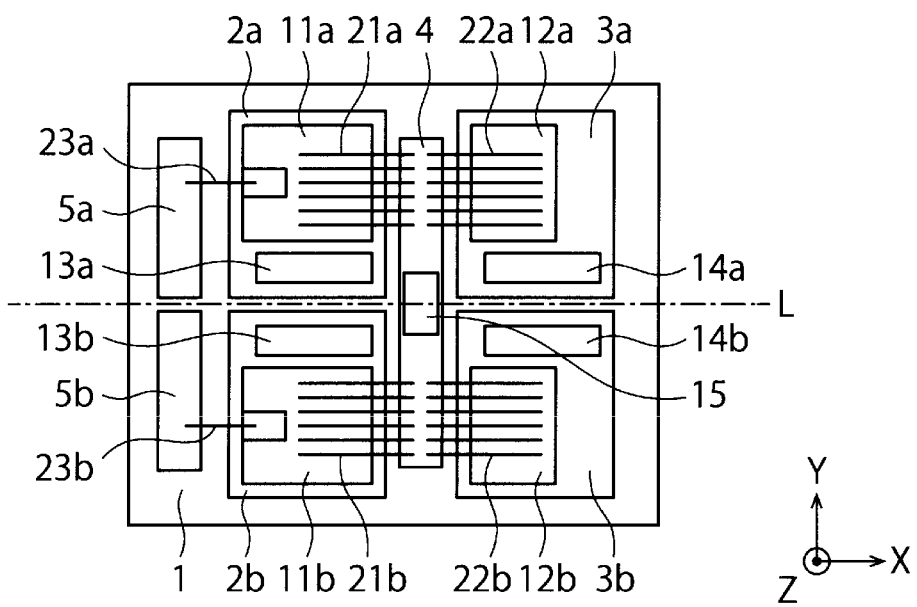
FIG. 1 is a plan view schematically showing a structure of a semiconductor device according to a first embodiment.

FIG. 1 is a plan view schematically showing a structure of a semiconductor device according to a first embodiment.

The semiconductor device of FIG. 1 includes an insulating substrate 1, first main electrode plates 2a and 2b, second main electrode plates 3a and 3b, a third main electrode plate 4, control electrode plates 5a and 5b, insulated gate bipolar transistor (IGBT) chips 11a and 11b (first semiconductor chips), diode chips 12a and 12b (second semiconductor chips), first terminals 13a and 13b, second terminals 14a and 14b, a third terminal 15, first bonding wires 21a and 21b, second bonding wires 22a and 22b, and third bonding wires 23a and 23b.

The insulating substrate 1 is, for example, an aluminum oxide substrate. In FIG. 1, an X direction and a Y direction that are parallel to a principal surface of the insulating substrate 1 and are perpendicular to each other and a Z direction that is perpendicular to the principal surface of the insulating substrate 1 are shown.

The IGBT chips 11a and 11b, each being a semiconductor chip with an IGBT, are provided on the first main electrode plates 2a and 2b, respectively. The first main electrode plates 2a and 2b are provided on the insulating substrate 1 and are electrically connected to collectors of the IGBT chips 11a and 11b, respectively.

The diode chips 12a and 12b, each being a semiconductor chip with a diode, are provided on the second main electrode plates 3a and 3b, respectively. The second main electrode plates 3a and 3b are provided on the insulating substrate 1 and are electrically connected to cathodes of the diode chips 12a and 12b, respectively.

The third main electrode plate 4 is provided on the insulating substrate 1. The third main electrode plate 4 is electrically connected to emitters of the IGBT chips 11a and 11b with the first bonding wires 21a and 21b, respectively, and is electrically connected to anodes of the diode chips 12a and 12b with the second bonding wires 22a and 22b, respectively.

The control electrode plates 5a and 5b are provided on the insulating substrate 1. The control electrode plates 5a and 5b are electrically connected to the gates of the IGBT chips 11a and 11b with the third bonding wires 23a and 23b, respectively.

The first main electrode plates 2a and 2b, the second main electrode plates 3a and 3b, the third main electrode plate 4, and the control electrode plates 5a and 5b are, for example, Cu (copper) foil.

The first terminals 13a and 13b are provided on surfaces of the first main electrode plates 2a and 2b, respectively. The second terminals 14a and 14b are provided on surfaces of the second main electrode plates 3a and 3b, respectively. The third terminal 15 is provided on a surface of the third main electrode plate 4.

In this embodiment, by electrically connecting the first terminals 13a and 13b and the second terminals 14a and 14b with a wiring line (not shown), the IGBT chips 11a and 11b and the diode chips 12a and 12b are connected in parallel.

Figure 2:
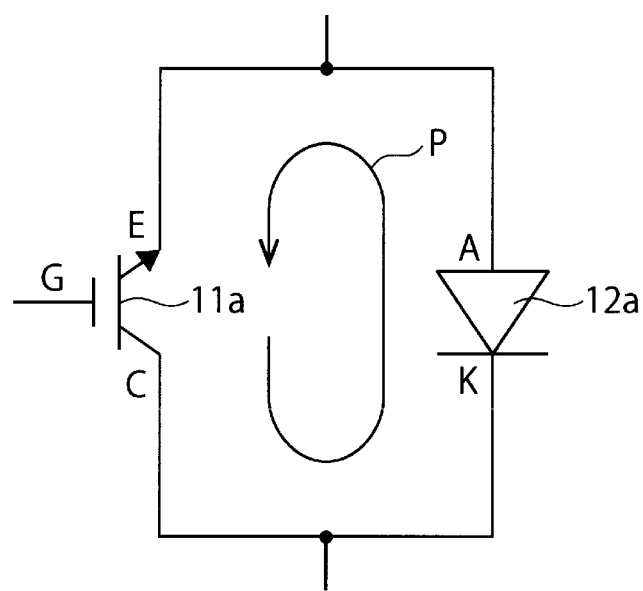
FIG. 2 is a circuit diagram showing part of the semiconductor device according to the first embodiment.

A circuit configuration of the semiconductor device of this embodiment is shown in FIG. 2. FIG. 2 is a circuit diagram showing a part of the semiconductor device according to the first embodiment. FIG. 2 shows a state in which the IGBT chip 11a and the diode chip 12a are connected in parallel.

In this embodiment, there is a need to suppress a malfunction of the semiconductor device that may occur when a voltage exceeding a gate breakdown voltage is applied to gates of the IGBT chips 11a and 11b or a breakdown voltage between main electrodes is applied between the electrodes of the IGBT chips 11a and 11b and the diode chips 12a and 12b due to the high-frequency oscillation. An arrow P in FIG. 2 schematically indicates the oscillation generated between the IGBT chip 11a and the diode chip 12a. According to this embodiment, as will be described below in detail, such an oscillation can be attenuated promptly.

(1) Comparison between the First Embodiment and a Comparative Example

Figure 3:
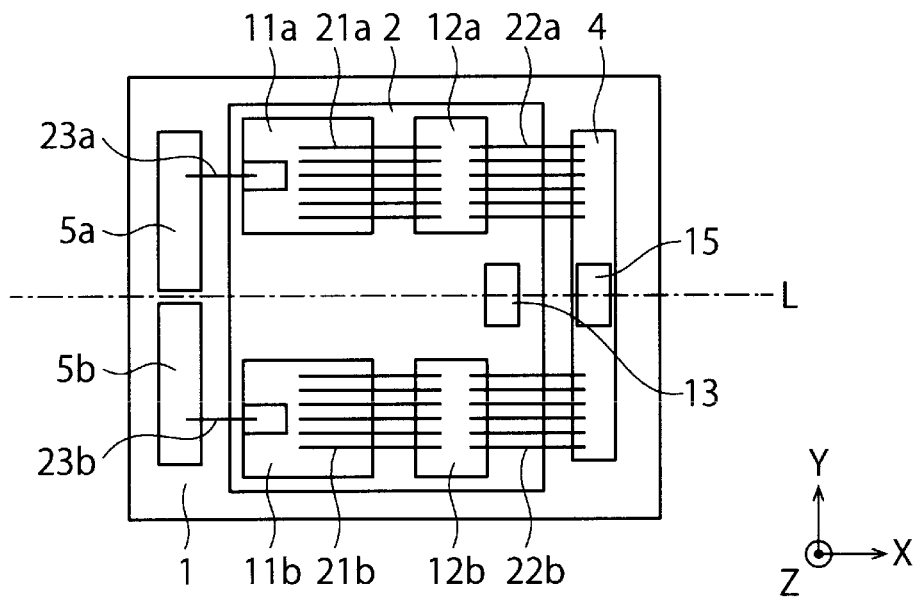
FIG. 3 is a plan view schematically showing a structure of a semiconductor device according to a comparative example.

Next, with reference to FIGS. 1 and 3, the first embodiment is compared with a comparative example. FIG. 3 is a plan view schematically showing a structure of a semiconductor device according to the comparative example.

In FIG. 3, the IGBT chips 11a and 11b and the diode chips 12a and 12b are provided on one main electrode plate 2. On the other hand, in FIG. 1, the IGBT chips 11a and 11b and the diode chips 12a and 12b are provided on the main electrode plates 2a, 2b, 3a, and 3b, respectively.

Therefore, in this embodiment, to connect these semiconductor chips 11a-12b in parallel, the first terminals 13a and 13b and the second terminals 14a and 14b are connected with the wiring line. As a result, in this embodiment, a resistance component and an inductance component of this wiring line are added to the paths between these semiconductor chips 11a-12b.

Moreover, in FIG. 3, the IGBT chip 11a and the diode chip 12a are directly connected to each other with the bonding wire 21a, and the IGBT chip 11b and the diode chip 12b are directly connected to each other with the bonding wire 21b. On the other hand, in FIG. 1, the semiconductor chips 11a-12b are connected with the bonding wires 21a-22b via the third main electrode plate 4.

Thus, in this embodiment, a resistance component and an inductance component of the third main electrode plate 4 are added to the paths between these semiconductor chips 11a-12b.

In general, an R component (resistance component) added to an LC circuit has an effect of decreasing an amplitude of oscillation and accelerating attenuation of the oscillation. Therefore, according to this embodiment, with the resistance component added in the above-described manner, the oscillation generated between the IGBT chips, between the diode chips, and between the IGBT chip and the diode chip can be attenuated promptly.

Moreover, according to this embodiment, with the inductance component added in the above-described manner, the resonance frequency ω=(LC) of the semiconductor device can be varied. Therefore, according to this embodiment, by setting, for example, the frequency at a frequency that is less likely to generate a resonance frequency, a malfunction of the semiconductor device due to the oscillation can be suppressed more effectively.

Furthermore, note that resistances between each of the semiconductor chips 11a-12b and each of the terminals 13a-15 of this embodiment is nearly equal to the resistances in the comparative example. As described above, according to this embodiment, a resistance component and an inductance component can be added to the paths between the semiconductor chips 11a-12b without increasing resistance between each of the semiconductor chips 11a-12b and each of the terminals 13a-15.

(2) Details of the Structure of the Semiconductor Device According to the First Embodiment Next, with reference to FIG. 1, the details of the structure of the semiconductor device according to the first embodiment will be described.

A line L denotes a center line between the IGBT chips 11a and 11b and between the diode chips 12a and 12b. In this embodiment, a pair of the IGBT chips 11a and 11b, a pair of the diode chips 12a and 12b, a pair of the first main electrode plates 2a and 2b, a pair of the second main electrode plates 3a and 3b, a pair of the control electrode plates 5a and 5b, a pair of the first terminals 13a and 13b, and a pair of the second terminals 14a and 14b are arranged in such a way as to be symmetric with respect to the center line L.

Such an arrangement according to this embodiment has an advantage that application of a high voltage is not likely to be applied only to one of the IGBT chips, because a resistance component and an inductance component added to the IGBT chips 11a and 11b can be uniform. The same goes for the diode chips 12a and 12b. Incidentally, each of the above-described pairs may be arranged asymmetrically with respect to the center line L. Moreover, the center line between the IGBT chips 11a and 11b may not be the same as the center line between the diode chips 12a and 12b.

Moreover, in this embodiment, the third main electrode plate 4 and the third terminal 15 are both arranged symmetrically with respect to the center line L. With such an arrangement according to this embodiment also has an advantage that, for example, a high voltage is not likely to be applied only to one of the IGBT chips (the same goes for the diode chips).

Furthermore, in this embodiment, the first terminals 13a and 13b are between the IGBT chips 11a and 11b, and the second terminals 14a and 14b are between the diode chips 12a and 12b. Such an arrangement according to this embodiment has an advantage that the first terminals 13a and 13b and the second terminals 14a and 14b can be connected by a short wiring line.

In addition, in this embodiment, the third main electrode plate 4 is between the IGBT chips 11a and 11b and the diode chips 12a and 12b. Such an arrangement according to this embodiment has an advantage that, for example, the third main electrode plate 4 can be easily connected to all of the IGBT chips 11a and 11b and the diode chips 12a and 12b.

Moreover, in this embodiment, the control electrode plates 5a and 5b are arranged on the respective sides of the IGBT chips 11a and 11b opposite from the third main electrode plate 4.

Figure 4:
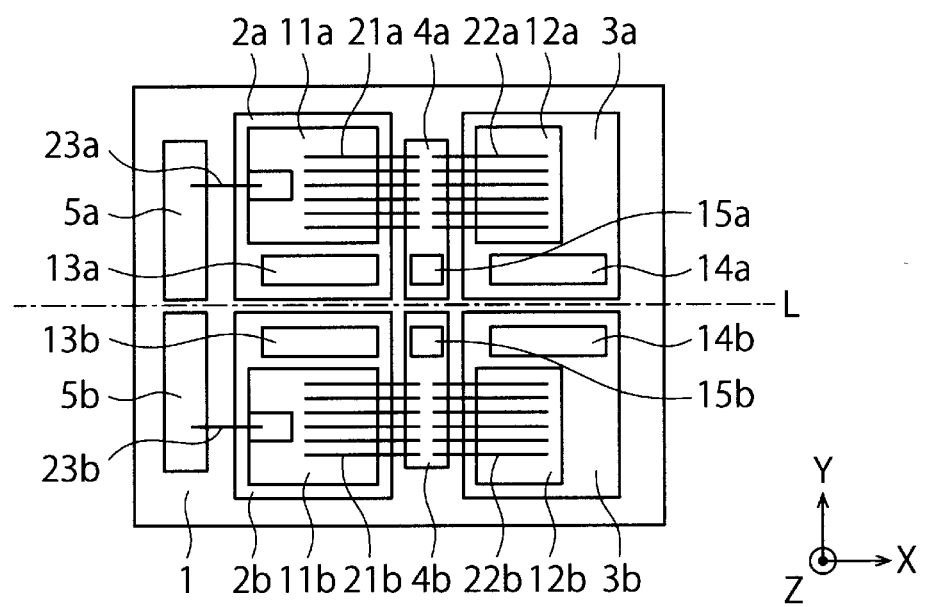
FIG. 4 is a plan view schematically showing a modified example of a semiconductor device according to the first embodiment.

Furthermore, as shown in FIG. 4, the semiconductor device of this embodiment may include a plurality of third main electrode plates 4a and 4b and a plurality of third terminals 15a and 15b. FIG. 4 is a plan view schematically showing a modified example of a semiconductor device according to the first embodiment.

In this modified example, the third main electrode plate 4a is electrically connected to the IGBT chip 11a and the diode chip 12a, and the third main electrode plate 4b is electrically connected to the IGBT chip 11b and the diode chip 12b. Moreover, in this modified example, by connecting the first terminals 13a and 13b and the second terminals 14a and 14b by a wiring line (not shown) and connecting the third terminals 15a and 15b by a wiring line (not shown), the semiconductor chips 11a-12b are connected in parallel. Furthermore, in this modified example, a pair of the third main electrode plates 4a and 4b and a pair of the third terminals 15a and 15b are arranged symmetrically with respect to the center line L.

Figure 5:
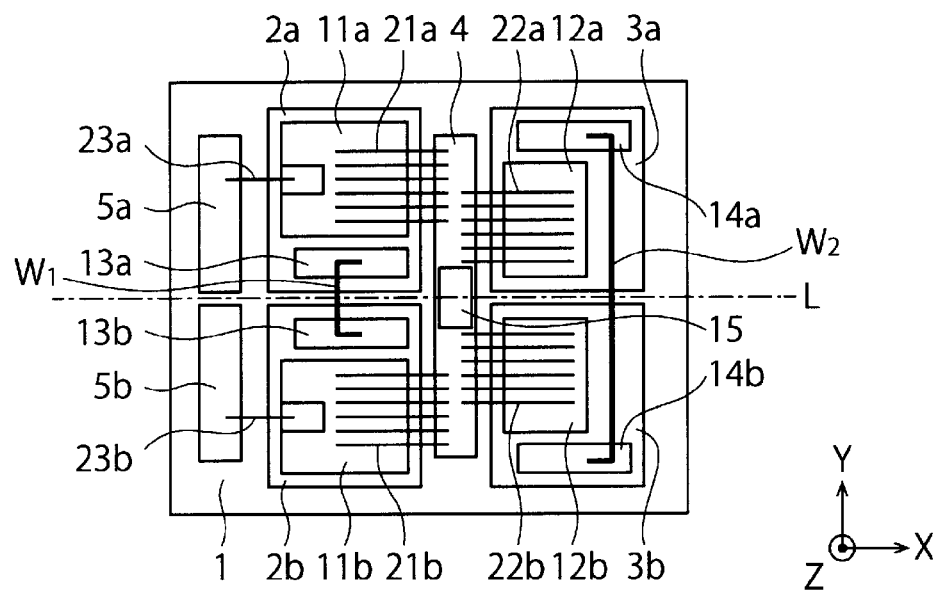
FIG. 5 is a plan view schematically showing another modified example of a semiconductor device according to the first embodiment.

Moreover, in this embodiment, the IGBT chips 11a and 11b and the diode chips 12a and 12b may be formed with the same substrate or may be formed with different substrates. For example, the IGBT chips 11a and 11b may be formed with a Si (silicon) substrate, and the diode chips 12a and 12b may be formed with a SiC (silicon carbide) substrate. In this case, a structure of FIG. 5 may be adopted. FIG. 5 is a plan view schematically showing a modified example of a semiconductor device according to the first embodiment.

In this modified example, the first terminals 13a and 13b are between the IGBT chips 11a and 11b, and the diode chips 12a and 12b are between the second terminals 14a and 14b. As a result, the first terminals 13a and 13b are located near each other, and the second terminals 14a and 14b are located away from each other.

FIG. 5 schematically depicts a first wiring line $W_1$ that electrically connects the first terminals 13a and 13b and a second wiring line $W_2$ that electrically connects the second terminals 14a and 14b. In this modified example, since a distance between the second terminals 14a and 14b is greater than a distance between the first terminals 13a and 13b, the second wiring line $W_2$ is longer than the first wiring line $W_1$.

The reason why such a structure is adopted in this modified example is as follows. Since the SiC substrate can reduce electric resistivity while maintaining high avalanche field intensity compared to the Si substrate, the SiC substrate has an advantage that, for example, a terminal end area of a device can be shortened. Moreover, the SiC substrate also has an advantage that the melting point of the SiC substrate is higher than the melting point of the Si substrate. However, when the SiC substrate is adopted, the resistance of the semiconductor chip is decreased, which will allow greater oscillation to occur between the diode chips 12a and 12b.

Therefore, in this modified example, the resistance and the inductance of the second wiring line $W_2$ are set to be greater than the resistance and the inductance of the first wiring line $W_1$ by making the second wiring line $W_2$ longer than the first wiring line $W_1$. Thus, according to this modified example, the oscillation between the diode chips 12a and 12b can be attenuated promptly. Moreover, according to this modified example, the resonance frequency of the semiconductor device can be varied greatly by the inductance of the second wiring line $W_2$.

Incidentally, when it is assumed that a length of each of the diode chips 12a and 12b in the Y direction is $\alpha$ and a distance between the diode chips 12a and 12b in the Y direction is $\beta$, the second wiring line $W_2$ of this modified example is longer than $2\alpha+\beta$.

Incidentally, in this embodiment, not only the diode chips 12a and 12b but also the IGBT chips 11a and 11b may be formed on a SiC substrate. Moreover, in this embodiment, one or more of the IGBT chips 11a and 11b and the diode chips 12a and 12b may be formed on a SiC substrate, and the remaining chips may be formed of a different substrate (for example, a Si substrate). The SiC substrate is an example of a substrate containing silicon and carbon.

As described above, in this embodiment, the first semiconductor chips 11a and 11b and the second semiconductor chips 12a and 12b are provided on the first main electrode plates 2a and 2b and the second main electrode plates 3a and 3b, respectively, and these semiconductor chips 11a-12b are electrically connected to the third main electrode plate 4. Therefore, according to this embodiment, the oscillation of the semiconductor device including the plurality of semiconductor chips 11a-12b can be attenuated promptly.

Second Embodiment

Figure 6:
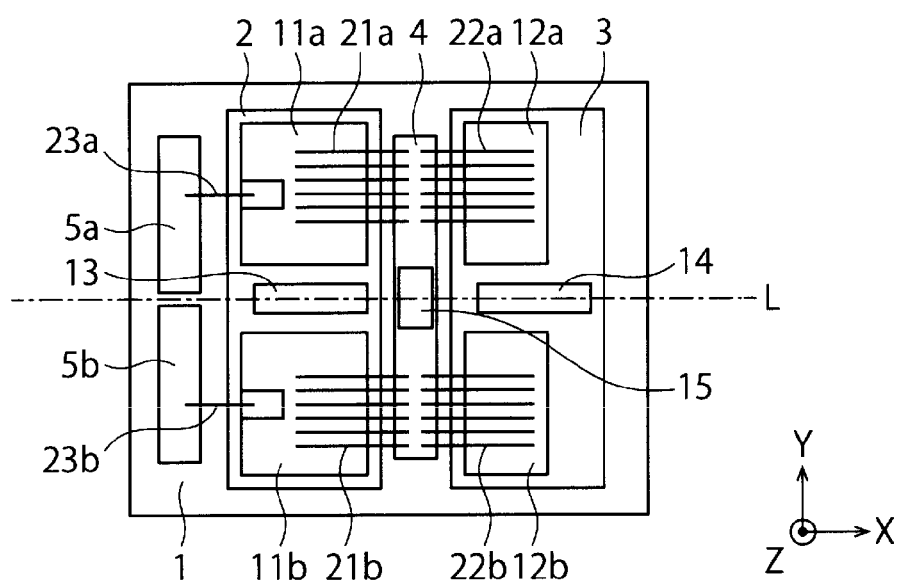
FIG. 6 is a plan view schematically showing a structure of a semiconductor device according to a second embodiment.

FIG. 6 is a plan view schematically showing a structure of a semiconductor device according to a second embodiment.

In FIG. 1, the first main electrode plates 2a and 2b are provided for the IGBT chips 11a and 11b, respectively, and the second main electrode plates 3a and 3b are provided for the diode chips 12a and 12b, respectively. Therefore, in FIG. 1, there is a one-to-one correspondence between the first main electrode plates 2a and 2b and the IGBT chips 11a and 11b, and there is a one-to-one correspondence between the second main electrode plates 3a and 3b and the diode chips 12a and 12b.

On the other hand, in FIG. 6, a plurality of IGBT chips 11a and 11b are provided on a single first main electrode plate 2, and a plurality of diode chips 12a and 12b are provided on a single second main electrode plate 3.

Moreover, in FIG. 6, a first terminal 13 shared by the IGBT chips 11a and 11b is provided on the first main electrode plate 2, and a second terminal 14 shared by the diode chips 12a and 12b is provided on the second main electrode plate 3. The first terminal 13 is arranged on the center line L between the IGBT chips 11a and 11b and is arranged symmetrically with respect to the center line L. Moreover, the second terminal 14 is arranged on the center line L between the diode chips 12a and 12b and is arranged symmetrically with respect to the center line L.

In this embodiment, by electrically connecting the first terminal 13 and the second terminal 14 with a wiring line (not shown), the IGBT chips 11a and 11b and the diode chips 12a and 12b are connected in parallel.

The semiconductor device according to the second embodiment has an advantage that, for example, an area of the insulating substrate 1 can be reduced more easily as compared to the semiconductor device according to the first embodiment.

Moreover, in the second embodiment, the IGBT chips 11a and 11b are directly connected to each other with the first main electrode plate 2, and the diode chips 12a and 12b are directly connected to each other with the second main electrode plate 3. Therefore, the structure of the second embodiment is effective when, for example, the oscillation between the IGBT chips 11a and 11b and the oscillation between the diode chips 12a and 12b are not so significant compared to the oscillation between the IGBT chips 11a and 11b and the diode chips 12a and 12b.

Incidentally, in the second embodiment, for example, the IGBT chip 11a and the diode chip 12a may be provided on the first main electrode plate 2, and the IGBT chip 11b and the diode chip 12b may be provided on the second main electrode plate 3. In this case, the IGBT chip 11a and the diode chip 12a are examples of the first semiconductor chip, and the IGBT chip 11b and the diode chip 12b are examples of the second semiconductor chip.

Furthermore, the semiconductor device of the first or second embodiment may include three or more IGBT chips 11 and three or more diode chips 12 on the same insulating substrate 1 or may include only one IGBT chip 11 and only one diode chip 12 on the same insulating substrate 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
an insulating substrate;
a first electrode plate disposed on the insulating substrate;
a second electrode plate disposed on the insulating substrate;
a third electrode plate disposed on the insulating substrate;
a fourth electrode plate disposed on the insulating substrate;
a fifth electrode plate disposed on the insulating substrate;
a first semiconductor element disposed on the first electrode plate, a first electrode of the first semiconductor element being connected to the first electrode plate;
a second semiconductor element disposed on the second electrode plate, a first electrode of the second semiconductor element being connected to the second electrode plate;
a third semiconductor element disposed on the third electrode plate, a first electrode of the third semiconductor element being connected to the third electrode plate;
a fourth semiconductor element disposed on the fourth electrode plate, a first electrode of the fourth semiconductor element being connected to the fourth electrode plate;
a first bonding wire electrically connecting a second electrode of the first semiconductor element to the fifth electrode plate;
a second bonding wire electrically connecting a second electrode of the second semiconductor element to the fifth electrode plate;
a third bonding wire electrically connecting a second electrode of the third semiconductor element to the fifth electrode plate; and
a fourth bonding wire electrically connecting a second electrode of the fourth semiconductor element to the fifth electrode plate.

2. The semiconductor device according to claim 1, wherein each of the first and third semiconductor elements includes a transistor, and each of the second and fourth semiconductor elements includes a diode.

3. The semiconductor device according to claim 1, wherein the fifth electrode plate is between the first electrode plate and the second electrode plate and between the third electrode plate and the fourth electrode plate.

4. The semiconductor device according to claim 1, wherein the second electrode of the first semiconductor element, the second electrode of the second semiconductor element, the second electrode of the third semiconductor element, and the second electrode of the fourth semiconductor element are electrically connected through the fifth electrode plate.

5. The semiconductor device according to claim 1, further comprising:
a fifth bonding wire electrically connecting a first terminal of the first electrode plate and a third terminal of the third electrode plate; and
a sixth bonding wire electrically connecting a second terminal of the second electrode plate and a fourth terminal of the fourth electrode plate.

6. The semiconductor device according to claim 5, wherein
the first and third terminals are between the first semiconductor element and the third semiconductor element,
the second and fourth semiconductor elements are between the second terminal and the fourth terminal, and
the fifth bonding wire is shorter than the sixth bonding wire.

7. The semiconductor device according to claim 6, wherein
the first and third semiconductor elements include a silicon substrate, and
the second and fourth semiconductor elements include a silicon carbide substrate.

8. The semiconductor device according to claim 5, wherein
the first and third semiconductor elements are between the first terminal and the third terminal,
the second and fourth terminals are between the second semiconductor element and the fourth semiconductor element, and
the fifth bonding wire is longer than the sixth bonding wire.

9. The semiconductor device according to claim 8, wherein
the first and third semiconductor elements include a silicon carbide substrate, and
the second and fourth semiconductor elements include a silicon substrate.

* * * * *